United States Patent [19]
Brainard et al.

[11] Patent Number: 6,076,133
[45] Date of Patent: *Jun. 13, 2000

[54] COMPUTER INTERFACE WITH HARDWIRE BUTTON ARRAY

[75] Inventors: James W. Brainard; Mark E. Taylor; Larry W. Kunkel, all of Houston; Stephen A. Walsh, Spring; Michael A. Provencher, Houston, all of Tex.

[73] Assignee: Compaq Computer Corporation, Houston, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/846,333

[22] Filed: Apr. 30, 1997

[51] Int. Cl.[7] ........................................................ G06F 9/46
[52] U.S. Cl. ............................................. 710/260; 713/300
[58] Field of Search ............................... 395/733, 750.01, 395/750.02

[56] References Cited

U.S. PATENT DOCUMENTS

| | | | |
|---|---|---|---|
| 3,811,025 | 5/1974 | Bach | 200/317 |
| 4,814,566 | 3/1989 | Sigl | 200/305 |
| 4,918,445 | 4/1990 | Bower | 341/26 |
| 5,280,283 | 1/1994 | Raasch et al. | 341/26 |
| 5,363,223 | 11/1994 | Beesley | 349/72 |
| 5,448,675 | 9/1995 | Leone et al. | 385/135 |
| 5,549,984 | 8/1996 | Dougherty | 429/61 |
| 5,574,447 | 11/1996 | Roylance | 341/22 |
| 5,630,142 | 5/1997 | Crump et al. | 395/750.05 |
| 5,642,110 | 6/1997 | Raasch et al. | 341/26 |
| 5,664,119 | 9/1997 | Jeffries et al. | 395/283 |

OTHER PUBLICATIONS

Compaq Presario 1060 Quick Specs, Compaq Computers, Jan. 8, 1997.
Sedra/Smith, Microelectronic Circuits, pp. 265–275, 307–309, 379–384, 906–909, 1991.

Primary Examiner—Ayaz R. Sheikh
Assistant Examiner—Jigar Pancholi
Attorney, Agent, or Firm—Conley, Rose & Tayon, P.C.; Michael F. Heim; Jonathan M. Harris

[57] ABSTRACT

The invention is a computer interface with a hardwired button array on the computer chassis for simulating the apparatus of common consumer electronic devices. Each button of the array of buttons is connected to at least two wires, with the depression of a button causing an electrical connection between the corresponding two wires. The voltage on one of these wires is forced to a steady-state logic low, while the voltage on the other wire is allowed to float electrically free. Nonetheless, the second wire is at a steady-state high voltage due to that wire's connection through a pull-up resistor to a voltage source. Upon electrical connection, the wire that is floating free acquires a logic low voltage. In response, a line state detector sends an interrupt signal to a microprocessor, which transitions the voltage on the wires forced to a steady-state logic low from a logic low to a free floating state. If the transitioned wire is connected to the depressed switch, the voltage on it rises since it is now connected through a pull-up resistor to a voltage source. Thus, the system can detect which button has been depressed since the system discerns both of the wires connected to the depressed button.

23 Claims, 4 Drawing Sheets

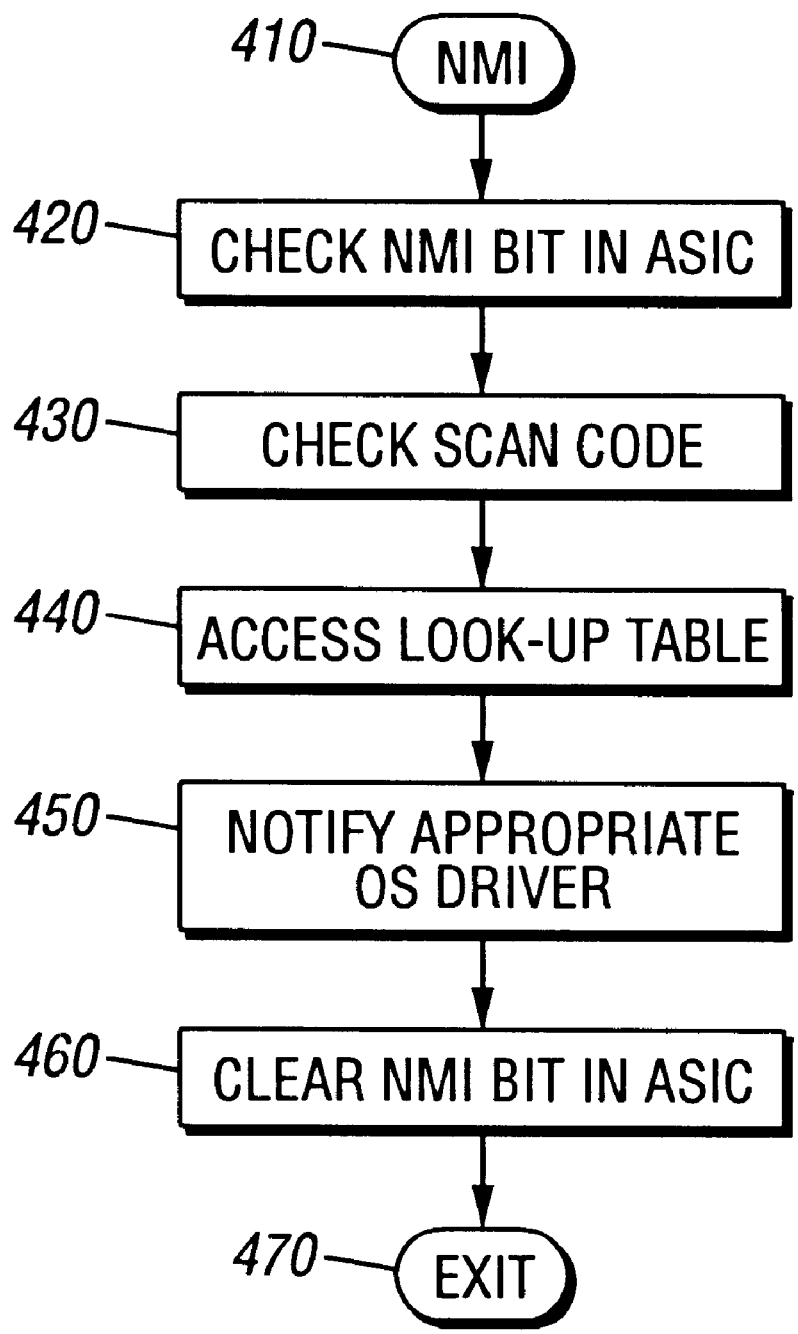

COMPUTER INTERFACE WITH HARDWIRE BUTTON ARRAY

CROSS-REFERENCE TO RELATED APPLICATIONS

This application relates to commonly assigned United States patent application, U.S. Ser. No. 08/846,544 now U.S. Pat. No. 5,987,537, filed concurrently herewith, entitled "Function Selector with External Hardwired Button Array on a Computer Chassis that Generates Interrupt to System Processor," the teachings of which are incorporated by reference as if fully set forth herein.

STATEMENT REGARDING FEDERALLY SPONSORED RESEARCH OR DEVELOPMENT

Not Applicable.

BACKGROUND OF THE INVENTION

Field of the Invention

The present invention relates generally to personal computer systems. More particularly, the present invention relates to an improved user interface for a personal computer that simulates the input/output interface used in other consumer electronics, such as compact disk (CD) players.

Computers have undergone a dramatic evolution since their introduction in the late 1970's and early 1980's. Early computer systems were difficult to use and understand. Typically, data was input to the computer by typing specific memorized commands into a keyboard. A one-task operating system such as MS-DOS (Microsoft Disk Operating System) was loaded on the computer and functioned to interpret and execute the commands.

Many improvements have been developed for computer systems since the introduction of the first systems. One of the areas that has improved is the user interface. For example, modern system keyboards have greater input capabilities than the keyboards used with the first computer systems. The early keyboards typically had 83 keys. To give the user additional options, keyboards with added keys (such as the CONTROL and FUNCTION keys) were introduced. However, the addition of keys to the original keyboard design had certain drawbacks. For example, a greater number of keys led to additional complexity and hence, confusion for the user. This confusion was compounded by a lack of continuity among applications for special keys or combinations of keys. For example, a key or a combination of keys that has one function with one application very likely has a different function when another application is running. Thus, although the addition of keys to the keyboard resulted in a more powerful keyboard, the trade-off was that the keyboard was more difficult to use.

For many computer users, memorizing and typing in commands to the computer via the keyboard is awkward and complicated. Because of this, alternate data input devices to the keyboard have been developed. One of the most popular of these alternate data input devices is a mouse. To maximize the usefulness of the mouse and to simplify entry of commands into a computer, software vendors have developed graphical user interfaces (GUI's) that implement graphics, special menu technology, and the mouse. One of these graphical user interfaces has been referred to as WIMP (which stands for Windows, Icons, Mouse, and Pull-down) menus. The WIMP concept implements several windows on the screen, icons, mouse operation, and pull-down menus containing functions. By using a mouse, the user can move a pointer, a cross-hair, or an arrow across the screen. When the user presses the mouse button, she can select items from a menu, mark text in a word processing program, or paint in a drawing program. However, as computer systems, operating systems, and software applications become increasingly powerful, many more icons or pull-down options are available for selection by the user. Operating systems and software applications may require a user to navigate many "levels" of icons or pull-down windows before reaching the desired application or command. Under these circumstances, rather than simplifying the entry of commands to the computer, the graphical user interface may actually add complexity and confusion. Instead of wasting time progressing through many levels of icons or pull-up windows, many users prefer once again to memorize commands and use the admittedly complicated and awkward keyboard to select applications and commands. Thus, there is a need for some input method or device that increases "user friendliness" by reducing operator confusion when performing or executing certain system functions.

The keyboard and the mouse share other common problems. For instance, computers often pause or "hang" for differing periods of time while being used by an operator (e.g. during auto-save, while printing, or while running another application). For some operating systems, such as the Microsoft Windows 95 operating system, an hourglass icon is shown on the computer screen during this period when the user is awaiting a system response. Unfortunately, neither the keyboard or the mouse are capable of interrupting the system processor during these periods, and the computer, therefore, is unresponsive to any user command except a reboot. A user thus experiences a loss of control that can be disconcerting during these wait periods. Therefore, a need also exists for some method or interface device to permit a user to enter certain commands to a computer to obtain an immediate response. The availability of an immediate response increases the "user friendliness" of the system by improving the responsiveness of the computer.

The computer industry is continually striving to provide additional computer enhancements to entice computer novices to purchase a computer system. Despite the near universal presence of the computer in the office environment, many people still are uncomfortable with computers and are unwilling to purchase or upgrade a home computer. Therefore, it is important for computer designers to add new features to each computer while at the same time giving the user a feeling of familiarity and comfort. Thus, the computer designer must add features (and complexity) while actually making the computer easier to use. In addition, new computer systems preferably are compatible with current computer systems. As such, any invention that enhances user friendliness by reducing operator confusion and by improving the responsiveness of the computer must also operate seamlessly with a broad range of already existing applications and systems. That is, the invention should be compatible with other computers and applications that are on the market such that an application that can operate on another computer can still operate without difficulty on a newly designed computer system.

As a further complication, all of these design criteria must be done in the framework of maintaining the affordability of the computer system. Thus, any new feature preferably can be implemented using existing hardware or inexpensive components. Thus, ideally, many more functions would be provided to the user without any additional cost, while increasing user friendliness.

One possible way to provide more capabilities is to add additional keys to the keyboard, but the addition of more keys to the keyboard would be impractical and would not solve many of the problems existing in prior art data input devices. First, more keys on the keyboard would complicate and change the layout of the keyboard, thereby leading to greater confusion by the user. This confusion would be exacerbated if the function associated with an additional key changed from application to application as is typical. Second, fitting additional keys on a keyboard would require a larger keyboard or smaller keys. Since keyboards are, to a great extent, standardized within the industry, adding keys to the keyboard is undesirable and might cause compatibility problems with keyboards presently on the market. Changes to the structure of the mouse similarly would be undesirable. Further, a more complicated keyboard or mouse would still suffer many of the same drawbacks as the simpler keyboards and mice. For example, an operator still would not be able to interrupt the system when it is busy, even where the user would prefer for the computer do something else.

Thus, a superior method or device is needed for the input of commands into the computer. Future computer processors will become increasingly more powerful, making the computer capable of performing even more functions than it does today. For example, a CD-ROM player in a modern computer often doubles as an audio CD player. Such a computer may also double as a television or an answering machine. Other roles for the computer will inevitably develop. However, these capabilities are undermined because the average user may be unable or unwilling to access these features. For instance, to use the CD-ROM player as an audio CD player, an operator is required to proceed with the mouse through multiple levels of icons before a CD is loaded and ready to play. The user must then use the mouse to select "Play Music" from a menu or screen before music is played from the CD. As the array of options increases, users will be faced with increasingly complex graphics user interfaces unless another solution is found.

The ideal solution would be to offset the increased computer capabilities with a "user friendly" interface to facilitate ease of use as much as possible. Furthermore, it would be desirable if an interface was developed that was equally effective, regardless of the operating system or application being run. It would further be desirable if the interface caused the computer to respond quickly to user commands. It would also be desirable if the user interface used components already present in computer systems to minimize the cost to implement the user interface.

SUMMARY OF THE INVENTION

The present invention solves the deficiencies of the prior art by including a small array of buttons that can be used to control certain computer system functions. The buttons can be conveniently located on the top of a mini-tower computer design to control the playback of CD's, answer telephone calls, and provide other desired capabilities by depressing a single button. The present invention preferably includes a small array of buttons that are capable of initiating a high level interrupt signal to the system processor so that the user can select certain system functions regardless of whether the process or is executing other applications. The circuitry identifies which switch of an array of switches has been activated by a user. In the preferred embodiment, each switch connects to two different lines capable of conducting electric current. One of these lines is allowed to float free, but is nonetheless at a steady state high voltage due to the line's connection to a voltage source via a pull-up resistor. The other electric line is forced to a logic low. Each of these lines is also connected to a line state detector. Upon closure of the switch, the two corresponding lines connect electrically, causing the voltage on the free floating line to drop, which is detected by the line state detector. In this manner, the line state detector to identify one of the lines connected to the activated switch.

To identify other lines that connect to the activated switch, the line state detector then allows the line that is normally forced to a logic low to float electrically free. Since this line is now connected through an activated switch to a voltage source, the voltage on this line rises. Thus, the line state detector identifies the second line that is connected to the activated switch.

Other features of the invention may include a register in the line state detector that reflects the electrical state of each line, and a look-up table in the line state detector that correlates a particular switch with a particular function on a computer. Upon detection of the first change in line state, the line state detector may send a signal to a microprocessor to indicate that a switch has been depressed. The microprocessor then takes appropriate action in response.

The present invention also includes a method for identifying which switch of an array of switches has been activated by a user. The method according to the preferred embodiment includes providing an array of switches, with two corresponding electrical lines connected to each switch. One of the electrical lines is forced to a logic low. The second line is held at a high voltage due to its connection via a pull-up resistor to a voltage source. Upon closure of the switch, the second line is forced to a logic low due to its connection to the first line through the activated switch. The first line is then allowed to float free and its voltage rises due to its connection to a voltage source. Having identified both lines that are connected to the activated switch, it is a simple matter to deduce which switch has been depressed.

Thus, the present invention comprises a combination of features and advantages which enable it to overcome various problems of prior devices. The various characteristics described above, as well as other features, will be readily apparent to those skilled in the art upon reading the following detailed description of the preferred embodiments of the invention, and by referring to the accompanying drawings.

BRIEF DESCRIPTION OF THE DRAWINGS

For a more detailed description of the preferred embodiment of the present invention, reference will now be made to the accompanying drawings, wherein:

FIG. 4 is a flow chart illustrating the preferred sequence executed by the microprocessor of the present invention upon receipt of a non-maskable interrupt signal.

DETAILED DESCRIPTION OF THE PREFERRED EMBODIMENT

Figure 1:
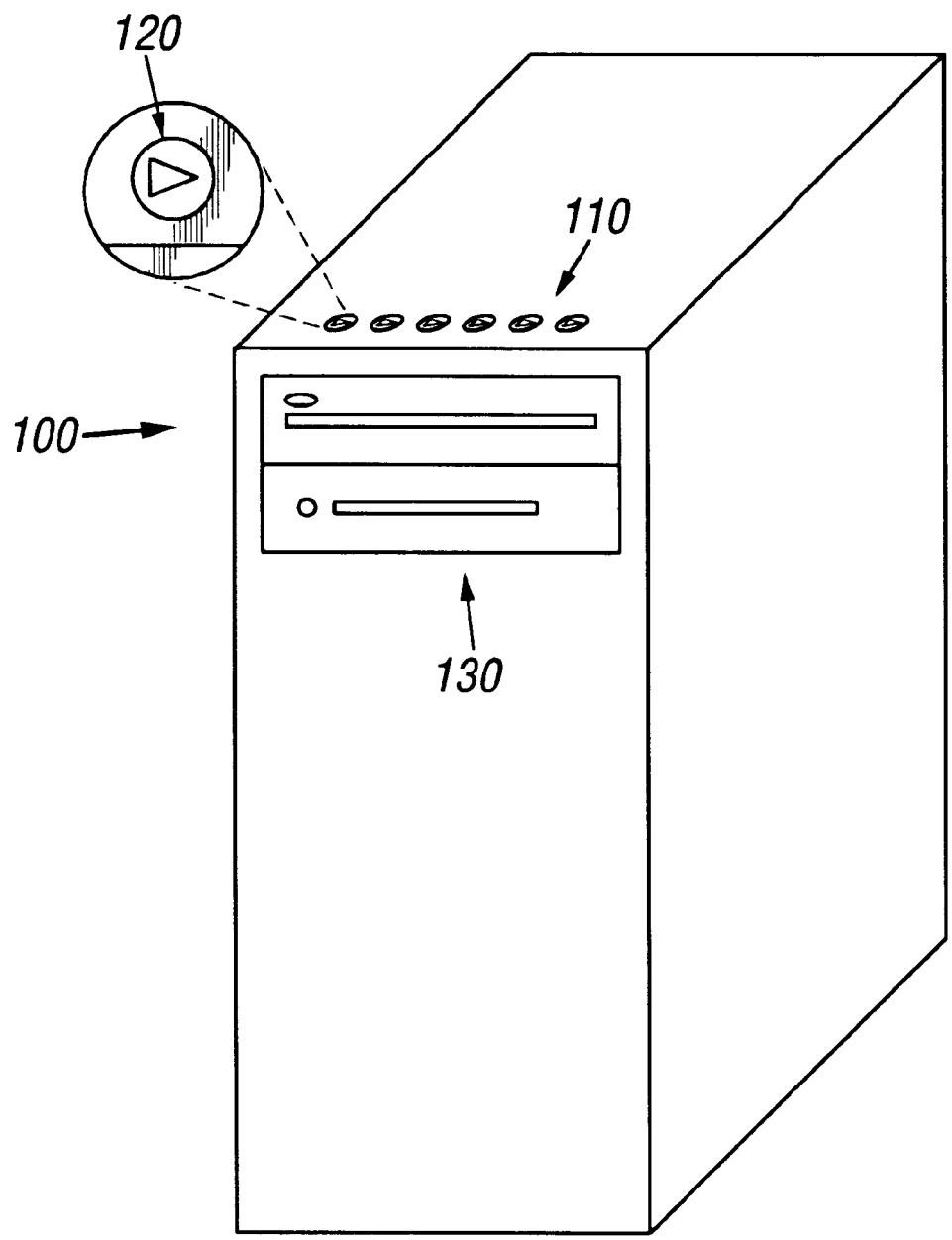
FIG. 1 is an illustration of an array of bezel buttons for providing a high priority user input to the computer system in accordance with the preferred embodiment.

Referring now to FIG. 1, the computer system constructed in accordance with the preferred embodiment includes an array of bezel buttons 110 located on the housing or chassis 100 of a computer. As shown in FIG. 1, the computer chassis 100 may be configured as a mini-tower design with buttons 110 located on the upper surface. Each button in the array preferably corresponds to a single function of the computer. In the preferred embodiment, the buttons are selected to correspond to functions that a user is familiar with from other household electronic appliances such as an audio CD player or a telephone answering machines. For example, button 120 is labeled with the familiar symbol for PLAY, corresponding to a PLAY button on an audio CD player. Upon depression of the PLAY button 120, the computer responds by playing an audio CD loaded into the CD-ROM drive 130. The preferred embodiment also includes buttons corresponding to STOP and other functions often present on consumer electronics. To distinguish PLAY on a CD player from PLAY on a telephone answering machine, an additional symbol may be added to the surface of the button. For example, a small telephone icon may be added to indicate a telephone answering machine function.

Thus, these buttons provide the user a mechanism to use the computer as another electronic appliance without the need to progress through the tedious routine normally demanded to initiate a computer program. This concept is described in a commonly assigned United States patent application, U.S. Ser. No. 08/846,544 now U.S. Pat. No. 5,987,537, filed concurrently herewith, entitled "Function Selector with External Hardwired Button Array on a Computer Chassis that Generates Interrupts to System Processor" which is incorporated by reference as if fully set forth herein. Furthermore, the buttons of FIG. 1 present the user with an interface that is familiar. Preferably, each button 110 continuously corresponds to the same function, regardless of what operating system or application is running.

Figure 2:
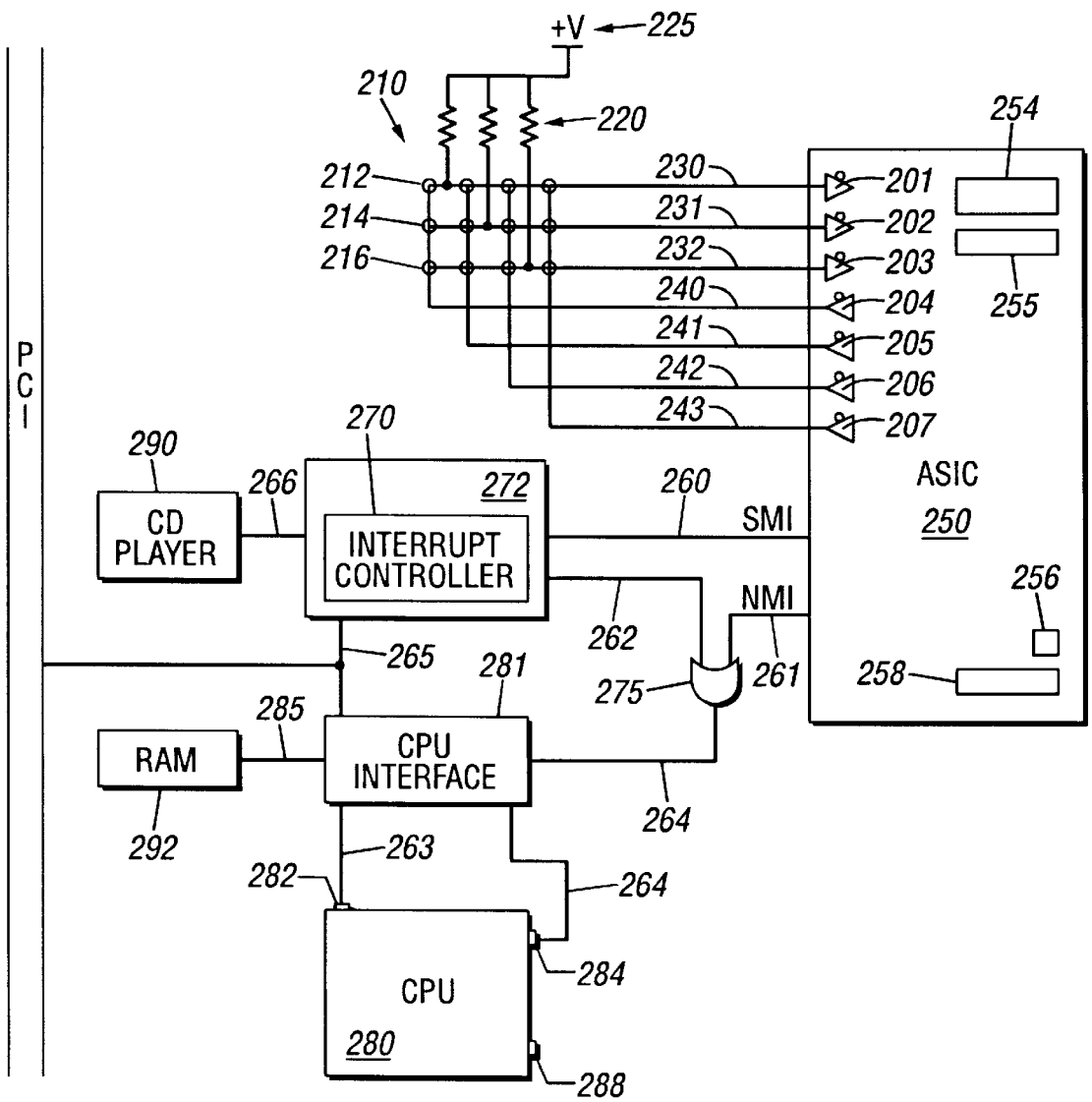
FIG. 2 shows a schematic circuit illustration of the preferred circuit implementation.

Referring now to FIG. 2, an exemplary schematic circuit diagram is shown for constructing an array of bezel buttons. As shown in FIG. 2, the computer system includes a CPU or microprocessor 280, a CPU interface controller 281 with associated RAM (Random Access Memory) 292, an ASIC (Application Specific Integrated Circuit) 250, and a CD player 290. ASIC 250 is a specially designed chip made by SMC (Standard Microsystems Corp). Address and data bus 285 preferably transmits signals between the microprocessor 280 and RAM 292 via the interface controller 281. Also shown is an array of touch-sensitive switches, generally depicted as array 210. One aspect of the invention is the utilization of the minimum total number of input and output lines. Thus, for twelve buttons the ideal electrical arrangement is a 3-by-4 array. A 6-by-2 array, requiring a total of eight input and output lines, therefore is not preferred. Three of the twelve switches are labeled 212, 214, and 216 for purposes of discussion. Each of the switches 210 connects to one of input lines 230, 231, or 232. Pull-up resistors 220 and positive voltage source 225 also are individually coupled to input lines 230, 231, 232. In addition, each of switches 210 connects to one of output lines 240, 241, 242, 243. Input lines 230–232 and output lines 240–243 all connect to ASIC 250.

The ASIC 250 preferably includes tri-state gates 201–207, with one of the tri-state gates each connected to input and output lines 230–232, 240–243. As is well known in the art, tri-state gates are capable of three different logic state outputs: a logic 0, a logic 1, or a high impedance. Thus, each line 240–243 may be latched to a high or low state, or may float free.

The ASIC 250 also preferably includes register 254. Register 254 reflects the logic states of tri-state gates 201–207. Since each tri-state gate has 3 logic states, each logic gate 201–207 requires 2 bits to reflect its current logic state. Therefore, register 254 should be twice as many bits wide as there are tri-state gates in the ASIC 250. For the illustrated seven tri-state gates 201–207, register 254 should be at least 14 bits wide. Register 254 preferably is read/write such that ASIC 250 can change the state of any tri-state gate by writing over the appropriate bits. ASIC 250 also can determine the state of any tri-state gate 201–207 by reading the respective bits of register 254.

The ASIC 250 also preferably includes one or more registers 255. Register 255 is at least as wide as the number of input lines 230–232 plus the number of output lines 240–243. Thus, for twelve switches and the corresponding seven lines, register 255 is at least seven bits wide. This allows a one-to-one correspondence between the bits in the register 255 and the states of the input and output lines 230–232, 240–243 such that one bit in the register 255 reflects the line state (low or high voltage) of the respective input or output line. Register 255 can be read at any time to determine the line voltage state of any of the input or output lines (with the understanding that the bits of register 255 are not strictly latched to the lines 230–232, 240–243, as explained below). Also as explained below, ASIC 250 includes a register 256 with a bit storing the status of an NMI_INT flag. The NMI_INT flag indicates whether the ASIC 250 should generate an interrupt signal to be delivered to the microprocessor 280. Further, ASIC 250 includes a look-up table 258 for correlating a particular button 210 with a particular function. Look-up table 258 preferably is implemented with a conventional read-only memory (ROM) device. In addition, ASIC 250 connects electrically to output lines 260 and 261. Line 260 carries an external SMI signal to program interrupt controller 270. Line 261 connects ASIC 250 to one input of a 2-input OR GATE 275. Interrupt controller 270 connects via line 262 to the other input of the OR GATE 275.

Microprocessor 280 includes a number of input and output pins in accordance with normal convention. The input pins include a system management interrupt (SMI) pin 282 and non-maskable interrupt (NMI) pin 284. CPU 280 also includes a general interrupt pin 288 for input of other, lower priority interrupts. Line 263 electrically connects SMI pin 282 to the output of CPU interface controller 281. Line 264 connects NMI pin 284 to another output of CPU interface controller 281. Thus, NMI pin 284 connects to interrupt controller 270 and ASIC 250 via CPU interface controller 281. Line 265 connects interrupt controller 270 to CPU interface controller 281. CD player 290 connects to the PIIX logic 272 by means of line 266.

In steady-state operation, input lines 230–232 are permitted to float freely by tri-state gates 201–203. These lines thereby exhibit a high voltage since they are connected to positive voltage source 225 through pull-up resistors 220. Conversely, output lines 240–243 are driven low by the tri-state gates 204–207.

Input lines 230–232 and output lines 240–243 normally do not make an electrical connection. However, upon the application of pressure to one of the touch-sensitive switches 210, an electrical connection is created between the respective input and output lines occurs. As used herein "switch" means any device that creates an electrical connection between corresponding input and output lines. For example, upon activation of pressure sensitive switch 212, an electrical connection is established between input line 230 and output line 240. Since line 240 is driven low in its steady state and line 230 is allowed to float free, upon electrical connection input line 230 acquires a low voltage. Since a tri-state gate 201–203 is in its high-impedance state, ASIC 250 can read the voltage on the attached button line 230–232, 240–243. Therefore, this drop in voltage along line 230 is detected by ASIC 250, which then changes the respective bit in register 255 to reflect this change in line state. Each bit in the register 255 is debounced by the ASIC, and therefore the noise associated with the mechanical contact is filtered.

All of the input lines are electrically ANDed together inside the ASIC 250. The output from this AND gate is provided on line 260 and carries an external SMI signal. Line 260 is preferably a computer input-output bus, such as ISA, PCI, or MCA. Thus, under steady-state conditions when the input lines 230–232 are all at a high voltage, the output of the AND gate is high. Upon a voltage drop along one of these input lines 230–232, the output of the AND gate goes low. Consequently, at this time ASIC 250 generates an external SMI signal along line 260.

The program interrupt controller 270, included within PIIX 272 as part of the INTEL® core logic, detects this change in state along line 260. In this case, the SMI signal is asserted low on line 260. Regardless of whether the SMI signal is asserted low or high, preferably interrupt controller 270 is edge sensitive such that any transition or change in state from low to high or from high to low along line 260 indicates an SMI interrupt signal from the ASIC 250. In any case, in response the interrupt handler 270 sets an EXT_SMI flag in an internal register (not shown). This flag indicates that an external SMI has been generated. The interrupt controller 270 then asserts an SMI signal to CPU interface controller 281 along line 265 in accordance with a known protocol. CPU interface controller 281 then transmits this SMI signal to SMI pin 282.

As is well known in the art, a range of interrupts of varying priority are available on an INTEL® compatible CPU. Normally, interrupts are used to prioritize tasks that must be executed by the CPU. For example, a high priority interrupt is often used when data arrives to a computer system modem. If the CPU ignores the incoming data, there is a risk that some data will be lost. Thus, system designers provide a high-priority interrupt to the CPU so that the CPU handles the incoming data from the modem sooner rather than later. Less pressing tasks, such as an interrupt from the keyboard, use lower priority interrupts. The program interrupt controller 272 is responsible for transmitting interrupts from a variety of sources to the CPU 280.

A first type of interrupt is the system management interrupt (SMI). SMI interrupts have heretofore generally been used by portable personal computers for power management purposes and thus these interrupts are largely ignored in modern-day desktop computer design. Nonetheless, an SMI interrupt is the highest priority interrupt for an INTEL® x86 processor. Even where there has been an operating system failure the SMI interrupt is effective, because the SMI interrupt is not dependent on the operating system (OS). Indeed, the operating system cannot operate while the CPU is handling a system management interrupt. An SMI may be asserted externally through a dedicated pin 282 located on the perimeter of the CPU chip 280.

A second type of interrupt is the non-maskable interrupt (NMI). Non-maskable interrupts generally are used only for signaling near-catastrophes, such as memory parity errors. They are the highest priority interrupt recognized by the OS of the computer. Thus, the CPU can use features of the operating system when handling an NMI interrupt that are not available when handling an SMI interrupt. On the other hand, the non-maskable interrupt is not as robust as the system management interrupt and the CPU does not respond to an NMI in as many circumstances. An NMI may be asserted externally through a second pin 284 located on the perimeter of the CPU chip 280.

Other external interrupts may be asserted through a third pin 288 located on the CPU 280. Input/output devices typically use one of these other lower-priority interrupts, which minimize the interruption to the flow of the processor. Since a range of external interrupts may be presented to this general interrupt pin, the system must have some way to determine which type of interrupt is being asserted.

Figure 3:
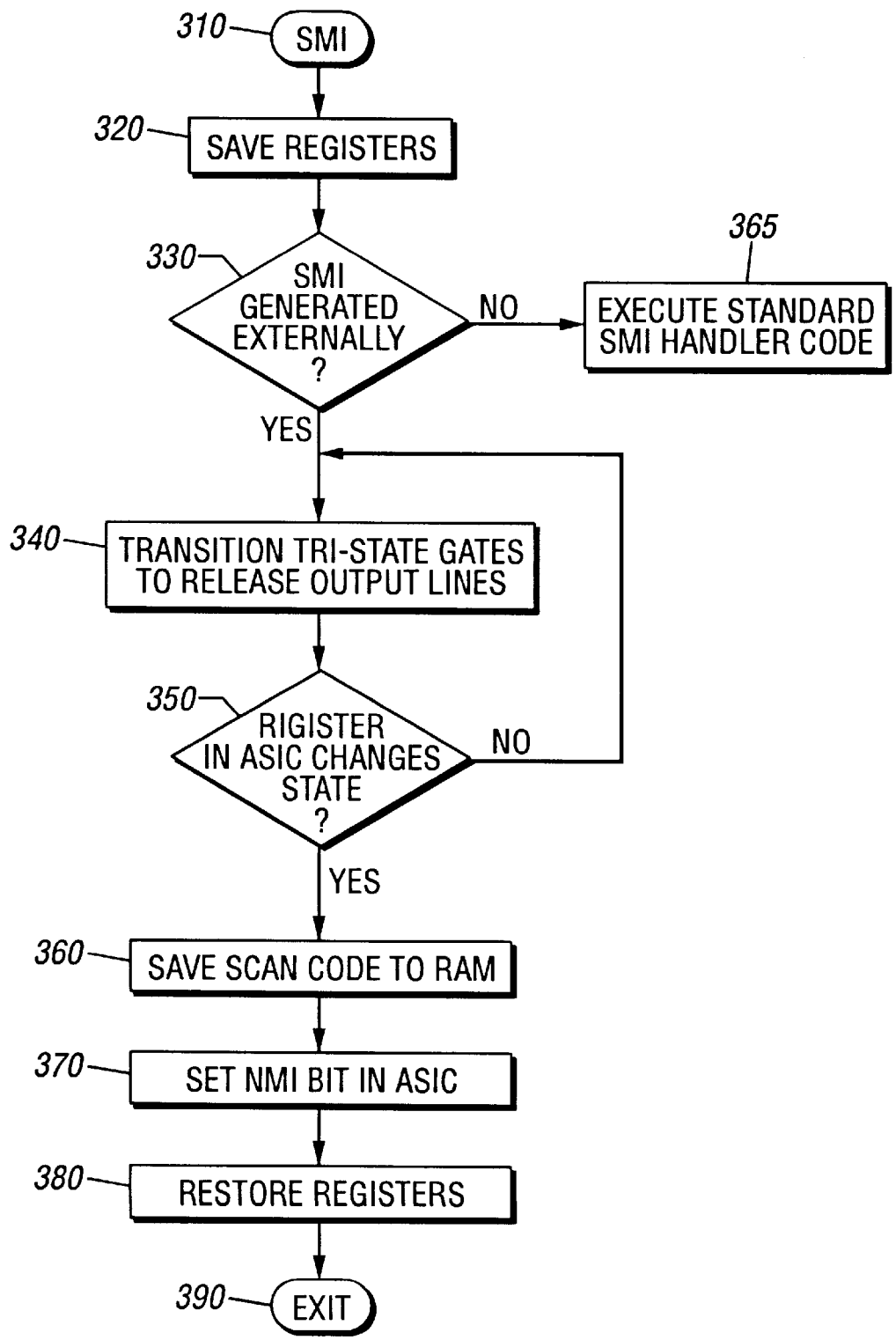
FIG. 3 is a flow chart illustrating the preferred sequence executed by the microprocessor of the present invention upon receipt of a system management interrupt signal.

FIG. 3 is a flow diagram indicating the steps followed by the microprocessor 280 of the preferred embodiment upon receipt of an SMI signal along line 263. Upon detection of an SMI signal at step 310, the CPU stops whatever activities it was engaged in and saves at step 320 the contents of relevant registers in RAM 292. The saving of register information is part of the standard routine executed by the microprocessor upon receipt of an SMI signal. The CPU must then determine whether the SMI was generated externally at step 330. To do this, the CPU runs machine code called the SMI handler code, stored in the ROM BIOS (Read Only Memory Basic Input Output System). Since access to ROM is slow, upon initialization of the computer (e.g. upon power-up) this SMI handler code is copied from the ROM BIOS to the system RAM 292. Information copied to RAM in this manner from the ROM is known as "shadow ROM." To check if the SMI was generated externally, the CPU executes the SMI handler code, preferably located in the shadow ROM at a predetermined address accessible to the CPU only when handling an SMI. The CPU then checks the state of the EXT_SMI flag in interrupt handler 270 at step 330. For the purposes of this disclosure, an SMI created for a reason other than in response to the depression of a switch 210 is irrelevant. Thus, the CPU (for this example) answers the question whether the SMI is an external SMI in the affirmative. However, in the event that the SMI is not an external SMI, the CPU continues to execute a normal SMI handler routine at step 365.

Once the CPU of the preferred embodiment checks the status of the EXT_SMI flag and determines at step 330 that the SMI is an external SMI, the CPU at steps 340–360 executes another block of code stored in shadow ROM. This second block of code is written in accordance with the teachings of this disclosure. These steps allow the microprocessor 280 to deduce which switch of array of switches 210 was activated.

In accordance with this code, at step 340 the CPU addresses the ASIC 250 and directs it to begin individually releasing each of the output lines 240–243 by transitioning the lines one at a time from their steady-state logic low to the third or free-floating state. Thus, tri-state gates 204–207 are placed into their third states one by one. At step 350 the CPU discerns which output line is connected to the depressed switch by monitoring register 255. Upon the release of an output line 240–243 by the tri-state gates 204–207, the register 255 remains unchanged if the released line is not connected to the activated switch (i.e. the voltage on the released line remains low). If, however, the released line is connected to the activated switch, the voltage on the released line rises. This change in voltage will be reflected in register 255 by a change of the value in the bit that corresponds to the respective output line 240–243. This bit is not latched to the line (i.e. register 255 has a memory), so that even after the ASIC 250 releases a different tri-state gate 204–207 and the tri-state gate that was previously released returns to its pre-released state, the bit that has changed status in register 255 continues to maintain that changed status.

The voltage on the output line changes because, as explained above, when a user depresses one of the pressure sensitive switches 210, an electrical connection is formed between the relevant input line and relevant output line (e.g. when switch 212 is pressed an electrical connection is formed between lines 230 and 240). Input lines 230–232 have a high-voltage steady state due to pull-up resistors 220 and positive voltage source 225. Once the relevant tri-state gate 204–207 releases the corresponding output line 240–243, the output line's voltage rises because of the connection to voltage source 225. Thus, by monitoring register 255, the microprocessor can determine at step 350 which switch in the array of switches 210 has been pressed. Preferably, all of the output lines are sequentially released, and the ASIC 250 does not cease releasing output lines upon the discovery of a first high-voltage output line. Sufficient time exists for the microprocessor 280 to rotationally release the output lines and detect the change in voltage on one of those lines since a user keeps the switch depressed for a period many times longer than that required to execute the above-described sequence.

After determining which switch has been activated, it is necessary to perform the function that corresponds to that switch. This preferably requires exit from handling of the system management interrupt. Exit from the handling of the SMI by the microprocessor is preferred because the system is limited when handling the SMI because the SMI is not recognized by the operating system of the computer. Thus, preparatory to exiting the handling of the SMI, the CPU 280 must record which button was depressed. Therefore, at step 360 the CPU records at a particular location in RAM 292 a scan code for the switch that uniquely identifies which switch the user depressed. In the preferred embodiment, the CPU stores this scan code at EBDA (Extended BIOS Data Area) offset 48. However, this scan code may also be stored in system memory. At step 370 the CPU sets a NMI_INT flag in register 256 of the ASIC 250 indicating that ASIC 250 is required to immediately generate a non-maskable interrupt. The CPU 280 at step 380 restores any data in any microprocessor register that was altered while the microprocessor handled the SMI. The CPU 280 then exits handling the SMI at step 390 and returns control of the CPU to the operating system.

Meanwhile, in response to the NMI_INT flag set in register 256, the ASIC 250 generates an NMI interrupt along line 261. This interrupt occurs on the order of about one micro-second after the NMI_INT flag is set. This interrupt cascades through OR GATE 275 and line 264 and arrives at NMI interrupt pin 284. Thus, as soon as microprocessor 280 exits handling of the SMI, the microprocessor is presented with an NMI at pin 284. Since an NMI is the highest priority interrupt recognized by the operating system, the microprocessor 280 immediately turns its attention to handling the NMI.

FIG. 4 is a flow chart illustrating the preferred sequence that the microprocessor executes upon receipt of the NMI signal. The NMI signal is received by the microprocessor 280 through pin 284 at step 410. At step 420, if the operating system is executing, the microprocessor checks the status of register 256 in ASIC 250 to determine if the NMI was generated by the ASIC 250. At step 430, the microprocessor checks EBDA offset 48 for scan code to determine which switch the user has depressed. CPU 280 then refers to look-up table 258 at step 440 to correlate a particular switch with a particular function. The microprocessor then at step 450 notifies the appropriate OS driver to execute the desired function. For example, if the depressed button corresponds to PLAY for the CD-ROM drive, the CD ROM player receives a signal to begin playing a loaded audio CD. At step 460 the microprocessor clears register 256, and at step 470, the microprocessor exits the NMI routine and returns to its previous activity.

For instance, in array of switches 210 the user may have pressed the bezel button 120 corresponding to PLAY for the CD ROM drive. This button is clearly labeled with a geometric shape that corresponds to PLAY and is familiar to most users from their experience with CD players and VCRs. An audio CD loaded into the CD ROM drive 130 thus begins playing with depression of only a single button. Moreover, there is no need for the user to wait while the computer is busy with other tasks. Instead, the computer responds relatively quickly to the user instruction, giving the computer the feel of a CD player and giving the user a sense of control. After the computer has begun playing the audio CD loaded in the CD ROM drive, the CPU 280 exits handling the NMI and resumes whatever activity it was executing before depression by the user of the PLAY switch. In similar fashion, a STOP CD button or other CD control button may be included as part of the bezel of buttons on the computer chassis.

Another function corresponding to one of array of button 210 could be sending a facsimile. In this case, instead of addressing a peripheral device on bus 285 such as the CD ROM drive 130, the microprocessor executes a facsimile application. Thus, shortly after the user presses the proper button on the computer chassis 100, the user is presented with a facsimile application on the computer screen. The user may then manipulate the application however he desires before the microprocessor returns to its previous activities. Therefore, this button too gives the computer the feel of a dedicated consumer electronics device and gives the user a sense of control. Similarly, the buttons on computer minitower 100 could correspond to the functions of a telephone answering machine or television.

The preferred embodiment of the present invention has numerous advantages over the prior art. First, the array of touch sensitive switches 210 allows the user an input data path that is an alternative to using the mouse or keyboard. Second, the array of switches 210 is superior to a keyboard, since each switch correlates to a command, and not just a character. While a vast number of commands may be entered via a keyboard, often times many keystrokes are required to transmit a single command to the computer. By equating one key with only one command, the user is given a greater sense of control over the functions of the computer and the computer is more "user-friendly." Third, the array of switches 210 is superior to a mouse because it eliminates the need to navigate through many levels of icons or pull-up windows as is often required by a typical computer interface. Fourth, each switch is labeled in a familiar way for the user, and thus the computer can simulate other popular consumer electronics. Fifth, the functions associated with the bezel buttons remain constant from application to application, thus minimizing confusion by the computer operator. Sixth, the array of switches 210 uses the highest priority interrupt, a priority higher than any used by a key on a keyboard. This results in a very nimble computer that can respond quickly to a command that has been input, even when the microprocessor is slow or is hung. This immediate response by the computer to the switches 210 enhances the user's sense of control. Seventh, the present invention's unique method and architecture for determining which switch has been depressed permits implementation with very few input and output lines while permitting a relatively large number of switches. Specifically, 2x lines provide a response for up to $x^2$ number of switches (i.e. 4 lines allows for an array of up to 4 buttons, whereas 8 lines allows for an array of up to 16 buttons). This allows a manufacturer to add many more functions or switches to an array 210 without a great increase in cost. Eighth, the invention uses components and interrupts that are already present on the microprocessor such that the affordability of the computer is maintained. Ninth, the array of buttons is placed at a convenient, easily accessible location for the user, such as on the surface of the computer mini-tower.

While preferred embodiments of this invention have been shown and described, modifications thereof can be made by one skilled in the art without departing from the spirit or teaching of this invention. The embodiments described herein are exemplary only and are not limiting. Many variations and modifications of the system and apparatus are possible and are within the scope of the invention. For example, the teachings disclosed herein may be applied to any microprocessor-based system including palm tops or personal digital assistants, and the term "computer system" thus encompasses any microprocessor-based system. Similarly, bezel buttons 110 could be located at places other than on the chassis. Functions from other devices may be simulated and more or fewer switches could be used. In addition to the PLAY button described above, the computer could respond to a particular switch activation by preparing a particular program, such as a facsimile program to send facsimiles to others. Accordingly, the scope of protection is not limited to the embodiments described herein, but is only limited by the claims that follow, the scope of which shall include all equivalents of the subject matter of the claims.

What is claimed is:

1. A computer system that includes an array of buttons for selecting certain system functions, said system comprising:
   at least one initially low voltage line;
   at least one initially high voltage line;
   an array of switches, wherein each switch is associated with one of said buttons and each of said switches connects electrically to one of said low voltage lines and to one of said high voltage lines;
   wherein said one of said low voltage lines and said one of said high voltage lines are not electrically connected in their steady states, but are electrically connected when said associated switch is activated; and
   a line state detector connected to said low voltage lines and to said high voltage lines, said line state detector configured to determine which button of said array of buttons has been depressed by placing fewer than all of the low voltage lines into a high-impedance state at the same time.

2. The system of claim 1, wherein said line state detector comprises:
   a logic device having at least a first state and a second state, said second state being a high-impedance state;
   said initially low voltage lines and said initially high voltage lines being connected to said line state detector such that one of said initially low voltage lines and said initially high voltage lines is associated with said logic device.

3. The system of claim 1, further comprising:
   a storage device associated with said line state detector, said storage device storing data reflecting voltage states of said initially low voltage lines and said initially high voltage lines;
   a look-up table associated with said line state detector, said look-up table correlating said voltage states of said initially low voltage lines and said initially high voltage lines with a particular system function.

4. The system of claim 2, further comprising:
   a controller; and
   wherein said line state detector further comprises a signal generator, said signal generator transmitting a signal to said controller in response to a change in voltage state of one of the high voltage lines.

5. The system of claim 4, wherein said controller transitions said logic device among two or more logic states after receipt of said signal.

6. The system of claim 3, wherein said look-up table is associated with said storage device so that the data in said storage device corresponds to a predetermined memory address location held in said look-up table.

7. The system of claim 4, wherein the signal transmitted by said signal generator comprises a system management interrupt.

8. The system of claim 2, further comprising:
   a second switch connected to at least one of said first and second lines; and
   a third line, said third line being connected to said second switch.

9. The system of claim 3, wherein the particular function is playing an audio CD.

10. A method for establishing which switch of an array of switches has been activated, comprising:
    providing an array of switches;
    providing a plurality of lines attached to said array of switches;
    coupling a first one of said plurality of lines to a voltage supply line through a resistor, such that the first line is pulled to the voltage of the supply line as long as the switches are open;
    maintaining others of said plurality of lines, including a second line, at a predetermined voltage that is different than said voltage of the supply line;
    establishing electrical connection between the first line and the second line by closing one of the switches, thereby pulling the first line to the predetermined voltage;
    allowing fewer than all of said other lines to float electrically free simultaneously; and
    detecting when the first line is pulled to the supply line voltage.

11. The method according to claim 10, further comprising:
    providing a storage location, said storage location holding data that indicates the state of said at least two lines;
    providing a look-up table, said look-up table correlating particular functions to said states of said at least two lines.

12. The method of claim 11, wherein said particular function comprises playing an audio CD.

13. The method of claim 10, wherein said notice signal is a system management interrupt signal and wherein said controller is a microprocessor.

14. The method of claim 10, further comprising the steps of:
    (g) providing a tri-state gate associated with one of said two lines;
    (f) transitioning said tri-state gate from a first state to a high impedance state.

15. The system of claim 10, wherein at least one of said switches corresponds to a function executed by a computer.

16. A method for establishing which switch of an array of switches has been activated, comprising:

provide input lines and output lines;

providing an array of switches, each switch of said array of switches being connected to one input line and one output line;

coupling said input lines to a power supply voltage;

forcing said output lines to a steady voltage;

activating one switch of said array of switches such that an electrical connection is established between one input line and one output line;

monitoring said input line for a first change in voltage;

transitioning each of said output lines to a free floating electrical state, one at a time; and monitoring said input line for a second change in voltage.

17. A computer system, comprising:

an enclosure surrounding said computer system;

a first plurality of buttons mounted on a surface of said enclosure, each button including a switch having a first terminal and a second terminal, wherein said button closes to connect said first and second terminals when said button is pushed and opens to disconnect said first and second terminals when said button is released;

a first resistor coupling the first terminals of said switches to a logic high level, wherein the first terminal of each switch is pulled to logic high if the switch is open, and wherein the first terminal of each switch is pulled to the logic level of the associated second terminal if the switch is closed;

a plurality of tristate buffers, each buffer driving the second terminal of one of the switches; and a logic device that controls said tristate buffers and that monitors the logic levels of the first terminals;

wherein said logic device drives each tristate buffer to a logic low level if no switch is pressed; and wherein if the first terminals are driven to logic low, then said logic device tristates each buffer in turn, at least until said first resistor pulls one of the first terminals to logic high.

18. A computer system, comprising:

an enclosure surrounding said computer system;

a first plurality of buttons mounted on a surface of said enclosure, each button including a switch having a pair of terminals, wherein said button closes to connect said pair of terminals when said button is pushed and opens to disconnect said pair of terminals when said button is released;

an application specific integrated circuit (ASIC) that has a plurality of tristate buffers, each buffer coupled to a switch of a button, said ASIC asserts an interrupt signal that requires no operating system involvement when a button is pressed;

a CPU coupled to said ASIC that detects said asserted interrupt signal and responds to the asserted interrupt signal by executing handler code to determine which of said plurality of buttons has been pressed; and system memory coupled to said CPU.

19. The computer system of claim 18 wherein said interrupt signal is a system management interrupt signal (SMI) and said handler code is SMI handler code.

20. The computer system of claim 19 further including a read only memory and wherein said SMI handler code is stored in said read only memory and copied to system memory for execution by said CPU.

21. The computer system of claim 19 wherein said CPU directs the ASIC to sequentially release output lines from various of its tristate buffers to a free-floating state.

22. The computer system of claim 21 wherein the ASIC further includes a buffer that has a bit associated with each of said switches and said CPU monitors the state of each bit as the CPU directs the ASIC to sequentially release each output line.

23. The computer system of claim 22 wherein the CPU determines that a particular one of said buttons is pressed if the value of the bit associated with that button's switch changes state.

* * * * *